US011355946B2

United States Patent
Chuang

(10) Patent No.: US 11,355,946 B2
(45) Date of Patent: Jun. 7, 2022

(54) COMMUNICATION ARCHITECTURE BETWEEN EAR BUD DEVICE AND CHARGING DEVICE BASED ON FEWER PINS

(71) Applicant: PixArt Imaging Inc., Hsin-Chu (TW)

(72) Inventor: Chia-So Chuang, Hsin-Chu (TW)

(73) Assignee: Audiowise Technology Inc., Hsinchu (TW)

( * ) Notice: Subject to any disclaimer, the term of this patent is extended or adjusted under 35 U.S.C. 154(b) by 652 days.

(21) Appl. No.: 16/393,912

(22) Filed: Apr. 24, 2019

(65) Prior Publication Data

US 2020/0343754 A1    Oct. 29, 2020

(51) Int. Cl.
*H02J 7/00* (2006.01)
*H04R 1/10* (2006.01)
*H03K 5/24* (2006.01)

(52) U.S. Cl.
CPC .............. *H02J 7/0072* (2013.01); *H03K 5/24* (2013.01); *H04R 1/1016* (2013.01); *H04R 1/1025* (2013.01)

(58) Field of Classification Search
USPC ........................................................ 320/107
See application file for complete search history.

(56) References Cited

U.S. PATENT DOCUMENTS

| 5,684,381 | A | * | 11/1997 | Ohtsuka | H02J 7/022 320/164 |
| 2015/0201271 | A1 | | 7/2015 | Diethorn | |
| 2015/0372493 | A1 | * | 12/2015 | Sankar | H02J 50/10 307/104 |
| 2017/0064433 | A1 | | 3/2017 | Hirsch | |
| 2019/0200113 | A1 | * | 6/2019 | Kim | H02J 7/0021 |
| 2019/0209053 | A1 | * | 7/2019 | Hamanaka | H04R 1/1008 |

FOREIGN PATENT DOCUMENTS

| CN | 107547964 A | 1/2018 |
| CN | 109495807 A | 3/2019 |
| CN | 109547884 A | 3/2019 |
| CN | 109660898 A | 4/2019 |

* cited by examiner

*Primary Examiner* — Bryce M Aisaka
(74) *Attorney, Agent, or Firm* — Winston Hsu

(57) ABSTRACT

A controlling circuit, utilized in an ear bud device which can be charged by a charging device, includes a voltage detection circuit and a processing circuit. The voltage detection circuit is coupled to a power input pin of a communication interface between the ear bud device and the charging device and used for detecting a voltage level of an analog power supply signal at the power input pin to generate a digital input signal. The processing circuit is coupled to the voltage detection circuit and used for receiving the digital input signal to obtain data information carried by the analog power supply signal outputted from the charging device.

19 Claims, 3 Drawing Sheets

COMMUNICATION ARCHITECTURE BETWEEN EAR BUD DEVICE AND CHARGING DEVICE BASED ON FEWER PINS

BACKGROUND OF THE INVENTION

1. Field of the Invention

The invention relates to a communication architecture/interface between a portable electronic device and a charging device based on fewer pins, and more particularly to a controlling circuit utilized in an ear bud device which can be charged by a charging device and an ear bud circuit of an ear bud device having a battery to be charged by a charging device.

2. Description of the Prior Art

Generally speaking, a conventional portable electronic device such as an ear bud device is configured to be coupled to a conventional charging box via a conventional communication standard/interface having three ports/pins comprising a power supply pin, a ground pin, and a data pin wherein the data pin is used to support a communication between the ear bud device and charging box. However, as electronic devices are getting smaller and smaller, the conventional communication standard/interface employing more ports/pins such as three pins does not meet the needs of users.

SUMMARY OF THE INVENTION

Therefore one of the objectives of the invention is to provide a controlling circuit utilized in an ear bud device which can be charged by a charging device and an ear bud circuit of an ear bud device having a battery to be charged by a charging device, to solve the problems mentioned above.

According to the embodiments, a controlling circuit utilized in an ear bud device which can be charged by a charging device is disclosed. The controlling circuit comprises a voltage detection circuit and a processing circuit. The voltage detection circuit is coupled to a power input pin of a communication interface between the ear bud device and the charging device and used for detecting a voltage level of an analog power supply signal at the power input pin to generate a digital input signal. The processing circuit is coupled to the voltage detection circuit, and is used for receiving the digital input signal to obtain data information carried by the analog power supply signal outputted from the charging device.

According to the embodiments, a controlling circuit utilized in an ear bud device which can be charged by a charging device is disclosed. The controlling circuit comprises a current generating circuit and a processing circuit. The current generating circuit is coupled to a power input pin of a communication interface between the ear bud device and the charging device and coupled to a ground pin of the communication interface, and is to be connected to the charging device via the power input pin and the ground pin. The processing circuit is coupled to the current generating circuit, and used for generating a digital output signal into the current generating circuit to control the current generating circuit to generate and transmit an analog current signal corresponding to the digital output signal to the charging device via the ground pin to send data information from the ear bud device to the charging device, the analog current signal having different current levels corresponding to different logic levels of the digital output signal.

According to the embodiments, an ear bud circuit of an ear bud device having a battery to be charged by a charging device is disclosed. The ear bud circuit comprises a power input pin, a ground pin, a charger supply pin, a charger circuit, and a controlling circuit. The power input pin is configured to be coupled to a power supply pin of the charging device. The ground pin is configured to be coupled to a ground pin of the charging device. The charger supply pin is configured to be coupled to a power input of the battery wherein the battery has a ground pin to be coupled to the ground pin of the charging device. The charger circuit is coupled between the power input pin and the ground pin of the ear bud circuit, and used for receiving an analog power supply signal provide by the charging device via the power input pin to convert the analog power supply signal to charge the battery. The controlling circuit is coupled between the power input pin and the ground pin of the ear bud circuit, and used for detecting a voltage level of the analog power supply signal at the power input pin of the ear bud circuit to generate a digital input signal to obtain data information carried by the analog power supply signal outputted from the charging device, and used for generating and transmitting an analog current signal corresponding to a digital output signal to the charging device via the ground pin of the ear bud circuit to send data information from the ear bud device to the charging device, the analog current signal having different current levels corresponding to different logic levels of the digital output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
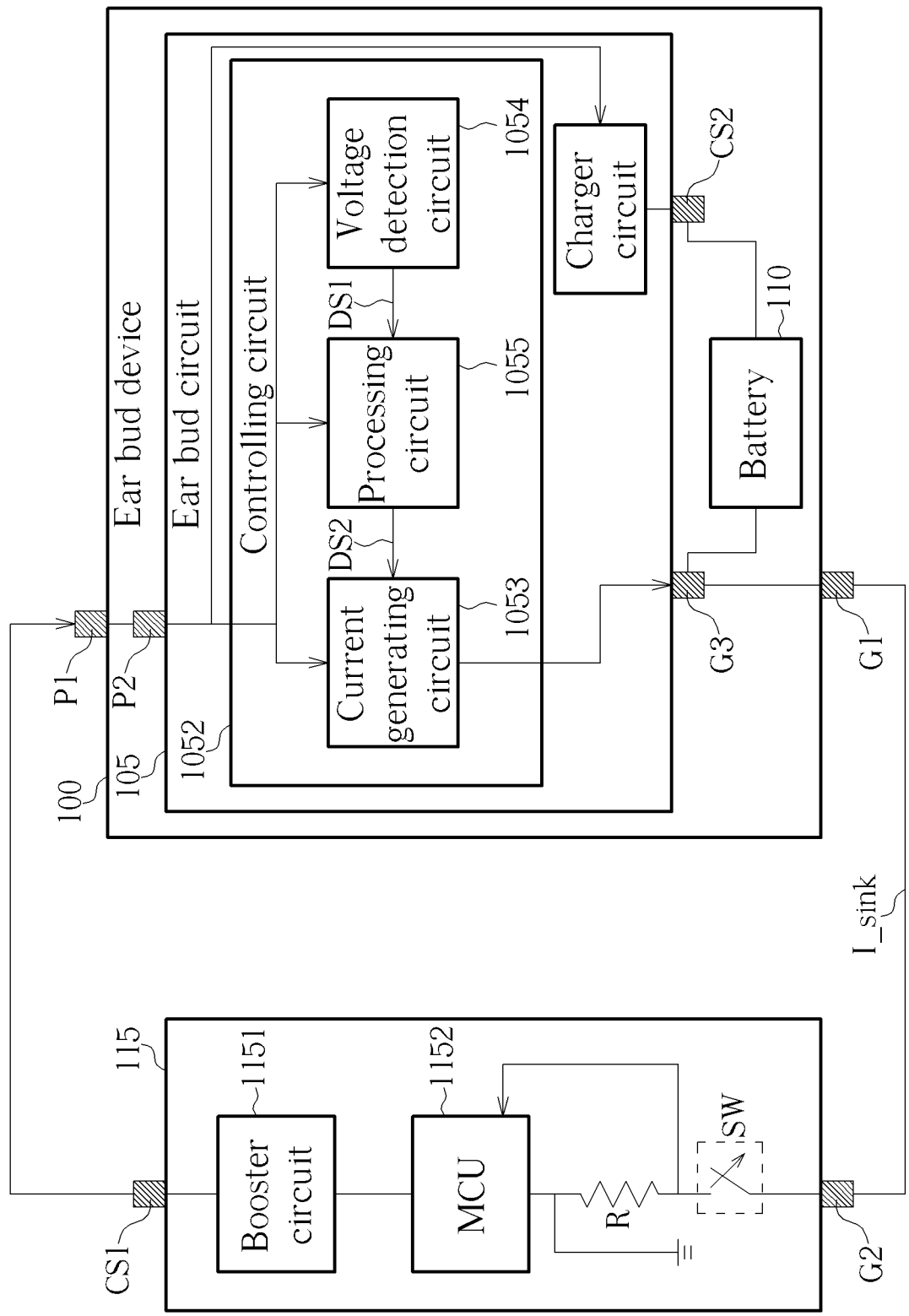
FIG. 1 is a diagram of an ear bud circuit of an ear bud device according to an embodiment of the invention.

FIG. 1 is a diagram of an ear bud circuit 105 of an ear bud device 100 according to an embodiment of the invention. The ear bud device 100 comprises the ear bud circuit 105 and a battery 110 which is to be charged by a charging device 115 such as a charging box which is configured to be externally connected to the ear bud device 100 if the ear bud device 100 is charged.

The ear bud circuit 105 is used to charge the battery 110 according to a power supply signal SP provided by the charging device 115 via a power input pin. A communication interface between the ear bud device 100 and charging device 115 employs two pins comprising pin P1/CS1 and pin G1/G2. The ear bud circuit 105 is capable of obtaining control/data information from the power supply signal SP and then performing a control operation based on the control/data information. In addition, the ear bud circuit 105 is capable of sending control/data information to the charging device 115 to communicate with the charging device 115 via a ground pin. The ear bud circuit 105 can communicate with the charging device 115 based on the sent/received control information. Only two pins, i.e. such power input pin and such ground pin, are needed for bi-directional communication.

In practice, when being charged, the ear bud device 100 is arranged to connected to the charging box 115 via only two pins wherein the power input pin P1 of ear bud device 100 is connected to the charger supply pin CS1 of the charging box 115 and the ground pin G1 of ear bud device 100 is connected to the ground pin G2 of charging box 115. If not charged, the ear bud device 100 is disconnected to the charging box 115. Once the ear bud device 100 is connected to the charging box 115, the ear bud device 100 may be charged by the charging box 115 automatically.

The ear bud device 100 comprises the ear bud circuit 105 and the battery 110 wherein the ear bud circuit 105 comprises a power input pin P2 coupled to the external power input pin P1, a ground pin G3 coupled to the external ground pin G1 and a ground of the battery 110, a charger supply pin CS2 coupled to a power input of the battery 110, a charger circuit 1051, and a controlling circuit 1052.

The power input pin P2 of ear bud circuit 105 is configured to be coupled to the power supply pin CS1 of the charging device 115 via the external power input pin P1 to receive the power supply signal SP. The ground pin G3 is configured to be coupled to the ground pin G2 of the charging device 115 via the external ground pin G1. The charger supply pin CS2 is configured to be coupled to the power input of the battery 110 wherein the ground of battery 110 is coupled to the ground pin G2 of the charging device 115 via the ground pins G3 and G1.

The charger circuit 1051 is coupled between the power input pin P1 of ear bud device 100 and the charger supply pin CS2 of the ear bud circuit 105, and is used for receiving the analog power supply signal SP provided by the charging device 115 via the power input pin P1 to convert the analog power supply signal SP to charge the battery 110.

The controlling circuit 1052 is coupled between the power input pin P1 and the ground pin G1 of the ear bud circuit 105, and for example comprises a current generating circuit 1053, a voltage detection circuit 1054, and a processing circuit 1055 such as a hardware logic circuit.

The voltage detection circuit 1054 is used for detecting a voltage level of the analog power supply signal SP at the power input pin P1 of the ear bud device 100 to generate a digital input signal DS1 with a high/low logic level to indicate bit '1' and bit '0' and transmit the digital input signal DS1 to the processing circuit 1055. That is, the voltage detection circuit 1054 can detect the voltage level change of analog power supply signal SP to detect and obtain digital data/control information carried by the analog power supply signal SP outputted from the charging device 115, and the digital data/control information is then outputted to the processing circuit 1055. Thus, when receiving the digital input signal DS1, the processing circuit 1055 can know information/control sent from the charging device 115. The transmission of such information and/or control is achieved via the power input pin P1 without an additional data pin.

Figure 2:
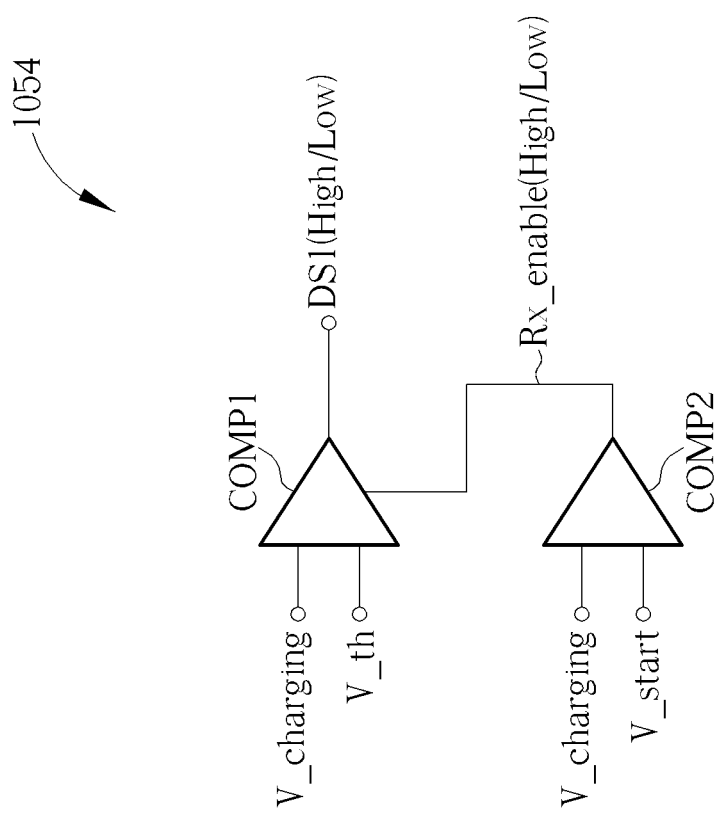
FIG. 2 is a diagram showing an example of the voltage detection circuit of FIG. 1 according to an embodiment of the invention.

In practice, the voltage detection circuit 1054 can be implemented by using at least one comparator circuit. FIG. 2 is a diagram showing an example of the voltage detection circuit 1054 of FIG. 1 according to an embodiment of the invention. As shown in FIG. 2, the voltage detection circuit 1054 comprises a first comparator COMP1 and a second comparator COMP2 wherein the second comparator COMP2 may be optional in other embodiments.

The first comparator COMP1 has a first input for receiving the voltage level V_charging of the analog power supply signal SP, a second input for receiving a voltage threshold V_th, and an output for generating the digital input signal DS1 with high/low logic level to the processing circuit 1055. The first comparator COMP1 is arranged to generate the digital input signal DS1 having a high logic level when the voltage level V_charging of the analog power supply signal SP is higher than the voltage threshold V_th, and is arranged to generate the digital input signal DS1 having a low logic level when the voltage level V_charging of the analog power supply signal SP is lower than the voltage threshold V_th. The voltage threshold V_th for example is configured as 4 Volts (but not limited).

The second comparator COMP2 has a first input for receiving the voltage level V_charging of the analog power supply signal SP, a second input for receiving an enable voltage level V_start, and an output for generating an enable signal Rx_enable to a power supply input of the first comparator COMP1 to activate/enable the first comparator COMP1. The second comparator COMP2 is arranged to generate the enable signal Rx_enable with a high logic level to enable the first comparator COMP1 when the voltage level V_charging of the analog power supply signal SP is higher than the enable voltage level V_start, and is arranged to generate the enable signal Rx_enable with a low logic level to disable the first comparator COMP1 when the voltage level V_charging of the analog power supply signal SP is lower than the enable voltage level V_start. The enable voltage level V_start for example is configured as 3 Volts smaller than the voltage threshold V_th. That is, the first comparator COMP1 is disabled when the voltage level V_charging is lower than the enable voltage level V_start, and the digital input signal DS1 is not generated. Only when the voltage level V_charging is higher than the enable voltage level V_start, and the first comparator COMP1 is activated and the digital input signal DS1 is generated. In addition, the voltage threshold V_th and enable voltage level V_start are programmable for users. It should be noted that the modifications are merely used for illustrative purposes and are not intended to be a limitation of the invention.

Refer to FIG. 1 again. In addition to receiving the data/control information sent from the charging device 115, the processing circuit 1055 can control the current generating circuit 1053 to generate and transmit data/control information of ear bud device 100 to the charging device 115 via the ground pin G1 so that the charging device 115 can obtain the data/control information without an additional data pin.

In practice, the processing circuit 1055 and the current generating circuit 1053 are also powered by the analog power supply signal SP. The processing circuit 1055 is arranged to generate and transmit a digital control signal DS2 to control the current generating circuit 1053, and the current generating circuit 1053 after receiving the digital control signal DS2 is arranged to generate an analog current signal as a sinking current I_sink to the charging device 115 via the ground pins G1 and G2 wherein the amount of sinking current I_sink of such analog current signal corresponds to the digital control signal DS2. For example, the amount of sinking current I_sink may be zero if the digital control signal DS2 is with a low logic level, and the amount of sinking current I_sink may be equal to an enough large current level if the digital control signal DS2 is with a high logic level; however, this is not intended to be a limitation.

The processing circuit 1055 can send the digital control signal DS2 to control the current generating circuit 1053 to generate the sinking current I_sink with different current levels corresponding to different digital information, so that the charging device 115 can decode and obtain the different digital information by detecting the different current levels.

For example, the charging device 115 comprises the charger supply pin CS1, the ground pin G2, a booster circuit 1151, a microcontroller 1152 such as MCU, a switch SW, and a resistor R. The booster circuit 1151 is coupled between the charger supply pin CS1 and MCU 1152, and is used for generating the voltage level of the power supply signal SP according to a control signal of MCU 1152 so that the ear bud device 100 can be powered and can also retrieve or obtain control/data information of MCU 1152 after detecting such voltage level.

The switch SW is turned on to become closed, and the resistor R becomes a current sensing resistor to sense or detect a voltage change caused by the current change. The resistor R is coupled between the ground level and one end of the switch SW. For example, if the sinking current I_sink is not generated, then the voltage drop across the resistor R is almost equal to zero and the voltage level at the end of switch SW is almost equal to zero such as a low logic level which is then transmitted to the MCU 1152. Thus, when the processing circuit 1055 controls the current generating circuit 1053 to generate the sinking current signal with a low current level corresponding to the low logic level, the MCU 1152 of charging device 115 can correctly decode or detect the information of the low logic level. Alternatively, if the sinking current I_sink is generated and is equal to an enough large sinking current, then the voltage drop across the resistor R becomes enough large and the voltage level at the end of switch SW is equal to a high logic level which is then transmitted to the MCU 1152. Thus, when the processing circuit 1055 controls the current generating circuit 1053 to generate the sinking current signal with a high current level corresponding to the high logic level, the MCU 1152 of charging device 115 can correctly decode or detect the information of the high logic level. That is, the current sensing resistor R can sense the different current levels and output the sensing results (i.e. the sensed current level(s)) to the MCU 1152, and then the MCU 1152 can retrieve or obtain the control/data information of processing circuit 1055 based on the sensing results. In practice, the MCU 1152 may comprise an analog-to-digital converter (ADC) inside to convert a sensed current level into a digital bit so as to generate a digital signal.

Additionally, in other embodiments, the voltage detection circuit 1054 may be excluded from the ear bud circuit 105 if the ear bud circuit 105 supports only one-directional communication and/or control, i.e. the control from the ear bud device 100 to the charging device 115.

Figure 3:
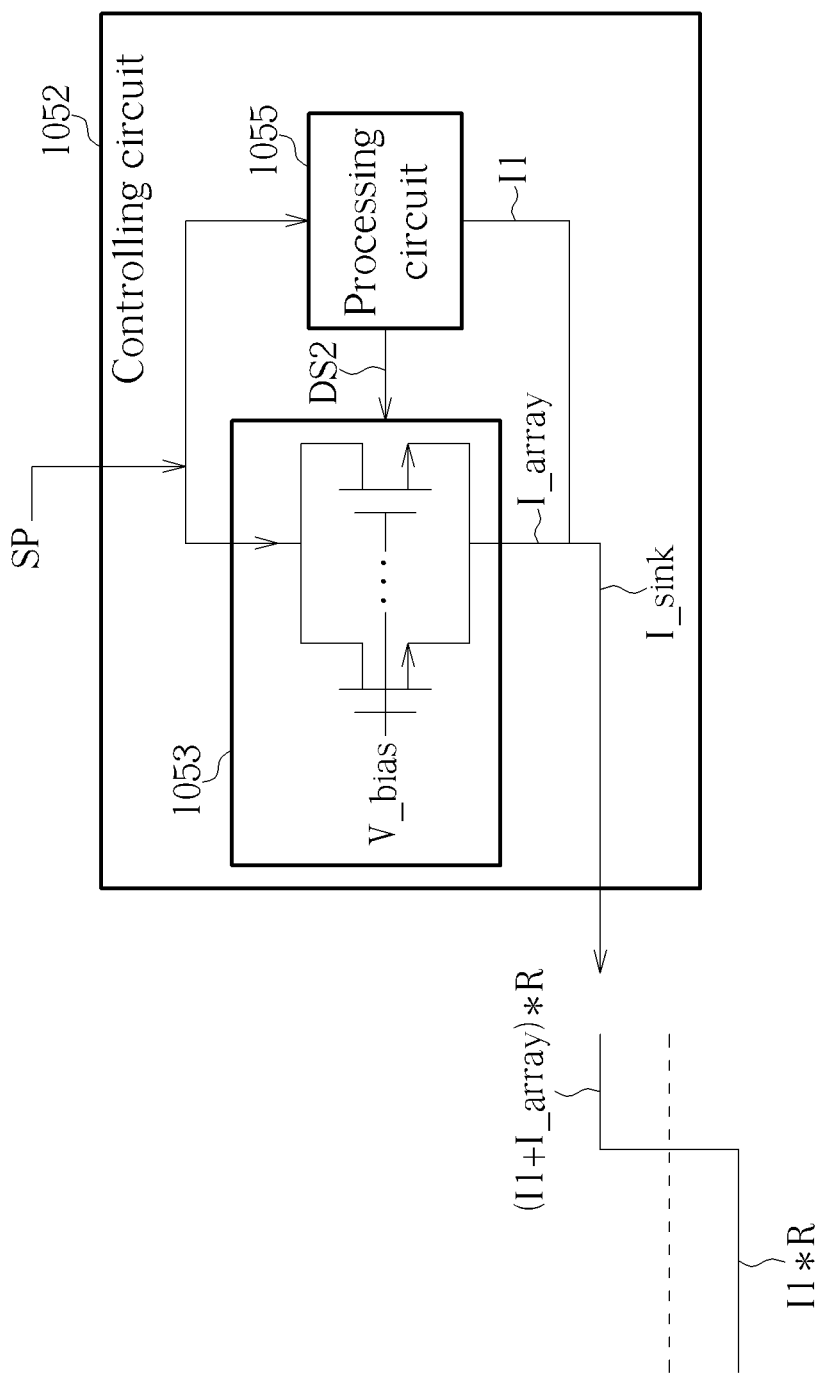
FIG. 3 is an example diagram of controlling circuit within the ear bud circuit of FIG. 1 according to an embodiment of the invention.

FIG. 3 shows an example diagram of controlling circuit 1052 within the ear bud circuit 105 according to an embodiment of the invention. The controlling circuit 1052 comprises the current generating circuit 1053 and the processing circuit 1055 but excludes a voltage detection circuit.

The current generating circuit 1053 for example can be implemented by using a programmable current array including multiple transistors biased by a bias voltage level V_bias to respectively provide/generate currents. That is, the current generating circuit 1053 provides a function of multiple current sinking and can generating an array sinking current I_array with different current levels based on the digital signal DS2 of processing circuit 1055.

Actually, the voltage level V_charging may be also transmitted and provided to the processing circuit 1055 to power up or enable the processing circuit 1055. A ground node of the processing circuit 1055 is also connected to the ground pin G1 of ear bud device 100 (not shown in FIG. 3). Thus, the total sinking current I_sink provided to the charger device 115 is equal to a sum of the array sinking current I_array and the current I1 flowing through or consumed by the processing circuit 1055.

In practice, in one embodiment, the processing circuit 1055 may be arranged to control the programmable current array of current generating circuit 1053 not to generate/output the array sinking current I_array if the processing circuit 1055 is arranged to notify the charging device 115 of a low logic level. In this situation, the total sinking current I_sink is equal to the current I1, and based on the current sensing resistor R the MCU 1152 can detect the voltage level of I1×R. Alternatively, the processing circuit 1055 may be arranged to control the programmable current array to generate/output the array sinking current I_array if the processing circuit 1055 is arranged to notify the charging device 115 of a high logic level. In this situation, the total sinking current I_sink is equal to the current I1 plus the array sinking current I_array, and based on the current sensing resistor R the MCU 1152 can detect the voltage level of (I1+I_array)×R which is higher than the voltage level of I1×R.

Thus, if the detected voltage level is more close to the voltage level of I1×R, the MCU 1152 can determine that the information sent by the processing circuit 1155 of ear bud device 100 is associated with the low logic level. If the detected voltage level is more close to the voltage level of (I1+I_array)×R, the MCU 1152 can determine that the information sent by the processing circuit 1155 of ear bud device 100 is associated with the high logic level. In practice, the MCU 1152 may use an average of voltage level of (I1+I_array)×R and the voltage level of I1×R as a threshold voltage to determine which one of the voltage level (I1+I_array)×R and voltage level of I1×R the actually detected voltage level is more close. The average is shown by a dotted line in FIG. 3.

In other embodiments, the current generating circuit 1053 may be excluded from the ear bud circuit 105 if the ear bud circuit 105 supports only one-directional communication, i.e. only the control/communication from the charging device 115 to the ear bud device 100. That is, in this example, the ear bud device 100 is arranged to receive data from and/or is controlled by the charging device 115; the ear bud device 100 is not arranged to control and send data to the charging device 115.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A controlling circuit utilized in an ear bud device which can be charged by a charging device, comprising:
   a voltage detection circuit, coupled to a power input pin of a communication interface between the ear bud device and the charging device, used for detecting a voltage level of an analog power supply signal at the power input pin to generate a digital input signal; and
   a processing circuit, coupled to the voltage detection circuit, for receiving the digital input signal to obtain data information carried by the analog power supply signal outputted from the charging device;

wherein the voltage detection circuit comprises:

a first comparator, having a first input for receiving the analog power supply signal, a second input for receiving a voltage threshold, and an output for generating the digital input signal; and a second comparator, having a first input for receiving the analog power supply signal, a second input for receiving an enable voltage level, and an output for generating an enable signal to a power supply input of the first comparator;

wherein the first comparator is arranged to generate the digital input signal having a high logic level when the voltage level of the analog power supply signal is higher than the voltage threshold, and arranged to generate the digital input signal having a low logic level when the voltage level of the analog power supply signal is lower than the voltage threshold; and, the second comparator is arranged to generate the enable signal to enable the first comparator when the voltage level of the analog power supply signal is higher than the enable voltage level, and arranged to generate the enable signal to disable the first comparator when the voltage level of the analog power supply signal is lower than the enable voltage level.

2. The circuit of claim 1, further comprising:

a current generating circuit, coupled to the power input pin of the communication interface and a ground pin of the communication interface, and is to be connected to the charging device via the power input pin and the ground pin;

wherein the processing circuit is arranged to generate a digital output signal into the current generating circuit to control the current generating circuit to generate and transmit an analog current signal corresponding to the digital output signal to the charging device via the ground pin to send data information from the ear bud device to the charging device, the analog current signal having different current levels corresponding to different logic levels of the digital output signal.

3. The circuit of claim 2, wherein the current generating circuit comprises a programmable current generating array comprising a plurality of transistors connected in parallel, and the processing circuit is arranged to turn on different transistors among the plurality of transistors to control the current generating circuit to generate different current amount levels.

4. The circuit of claim 2, wherein the processing circuit is coupled to the power input pin and the ground pin, and the analog current signal and a current signal passing through the processing circuit are transmitted via the ground pin to the charging device.

5. The circuit of claim 2 is to be connected to the charging device via only the power input pin and the ground pin.

6. A controlling circuit utilized in an ear bud device which can be charged by a charging device, comprising:

a current generating circuit, coupled to a power input pin of a communication interface between the ear bud device and the charging device and coupled to a ground pin of the communication interface, and is to be connected to the charging device via the power input pin and the ground pin;

a voltage detection circuit, coupled to the power input pin of the communication interface between the ear bud device and the charging device, used for detecting a voltage level of an analog power supply signal at the power input pin to generate a digital input signal, and the voltage detection circuit comprises:

a first comparator, having a first input for receiving the analog power supply signal, a second input for receiving a voltage threshold, and an output for generating the digital input signal; and a second comparator, having a first input for receiving the analog power supply signal, a second input for receiving an enable voltage level, and an output for generating an enable signal to a power supply input of the first comparator;

wherein the first comparator is arranged to generate the digital input signal having a high logic level when the voltage level of the analog power supply signal is higher than the voltage threshold, and arranged to generate the digital input signal having a low logic level when the voltage level of the analog power supply signal is lower than the voltage threshold; and, the second comparator is arranged to generate the enable signal to enable the first comparator when the voltage level of the analog power supply signal is higher than the enable voltage level, and arranged to generate the enable signal to disable the first comparator when the voltage level of the analog power supply signal is lower than the enable voltage level; and a processing circuit, coupled to the current generating circuit, for receiving the digital input signal to obtain data information carried by the analog power supply signal outputted from the charging device, generating a digital output signal into the current generating circuit to control the current generating circuit to generate and transmit an analog current signal corresponding to the digital output signal to the charging device via the ground pin to send data information from the ear bud device to the charging device, the analog current signal having different current levels corresponding to different logic levels of the digital output signal.

7. The circuit of claim 6, wherein the current generating circuit comprises a programmable current generating array comprising a plurality of transistors connected in parallel, and the processing circuit is arranged to turn on different transistors among the plurality of transistors to control the current generating circuit to generate different current amount levels.

8. The circuit of claim 6, wherein the processing circuit is coupled to the power input pin and the ground pin, and the analog current signal and a current signal passing through the processing circuit are transmitted via the ground pin to the charging device.

9. The circuit of claim 6 is to be connected to the charging device via only the power input pin and the ground pin.

10. An ear bud circuit of an ear bud device having a battery to be charged by a charging device, comprising:

a power input pin, to be coupled to a power supply pin of the charging device;

a ground pin, to be coupled to a ground pin of the charging device;

a charger supply pin, to be coupled to a power input of the battery wherein the battery has a ground pin to be coupled to the ground pin of the charging device;

a charger circuit, coupled between the power input pin and the ground pin of the ear bud circuit, for receiving an analog power supply signal provide by the charging device via the power input pin to convert the analog power supply signal to charge the battery; and a controlling circuit, coupled between the power input pin and the ground pin of the ear bud circuit, for detecting a voltage level of the analog power supply signal at the power input pin of the ear bud circuit to generate a digital input signal to obtain data information carried by the analog power supply signal outputted from the charging device, and for generating and transmitting an analog current signal corresponding to a digital output signal to the charging device via the ground pin of the ear bud circuit to send data information from the ear bud device to the charging device, the analog current signal having different current levels corresponding to different logic levels of the digital output signal; the controlling circuit comprises:

a voltage detection circuit, coupled to the power input pin of a communication interface between the ear bud device and the charging device, used for detecting a voltage level of the analog power supply signal at the power input pin to generate the digital input signal; and a processing circuit, coupled to the voltage detection circuit, for receiving the digital input signal to obtain the data information carried by the analog power supply signal outputted from the charging device;

wherein the voltage detection circuit comprises:
- a first comparator, having a first input for receiving the analog power supply signal, a second input for receiving a voltage threshold, and an output for generating the digital input signal; and
- a second comparator, having a first input for receiving the analog power supply signal, a second input for receiving an enable voltage level, and an output for generating an enable signal to a power supply input of the first comparator;

wherein the first comparator is arranged to generate the digital input signal having a high logic level when the voltage level of the analog power supply signal is higher than the voltage threshold, and arranged to generate the digital input signal having a low logic level when the voltage level of the analog power supply signal is lower than the voltage threshold; and, the second comparator is arranged to generate the enable signal to enable the first comparator when the voltage level of the analog power supply signal is higher than the enable voltage level, and arranged to generate the enable signal to disable the first comparator when the voltage level of the analog power supply signal is lower than the enable voltage level.

11. The ear bud circuit of claim 10 is to be connected to the charging device via only the power input pin and the ground pin of the ear bud circuit.

12. A controlling circuit utilized in an ear bud device which can be charged by a charging device, a communication interface being disposed between the ear bud device and the charging device, the controlling circuit being coupled between a power input pin and a ground pin of the communication interface and being coupled to the charging device only via the power input pin and the ground pin, and the controlling circuit comprises:

a voltage detection circuit, coupled to the power input pin, for detecting a voltage level of an analog power supply signal at the power input pin to generate a digital input signal;

a processing circuit, coupled to the voltage detection circuit, for receiving the digital input signal to obtain data information carried by the analog power supply signal outputted from the charging device; and a current generating circuit, coupled to the processing circuit, to be connected to the charging device via the power input pin and the ground pin;

wherein the processing circuit is arranged to generate a digital output signal into the current generating circuit to control the current generating circuit to generate and transmit an analog current signal corresponding to the digital output signal to the charging device via the ground pin to send data information from the ear bud device to the charging device, the analog current signal having different current levels corresponding to different logic levels of the digital output signal.

13. The circuit of claim 12, wherein the voltage detection circuit comprises:

a first comparator, having a first input for receiving the analog power supply signal, a second input for receiving a voltage threshold, and an output for generating the digital input signal;

wherein the first comparator is arranged to generate the digital input signal having a high logic level when the voltage level of the analog power supply signal is higher than the voltage threshold, and arranged to generate the digital input signal having a low logic level when the voltage level of the analog power supply signal is lower than the voltage threshold.

14. The circuit of claim 13, wherein the voltage detection circuit further comprises:

a second comparator, having a first input for receiving the analog power supply signal, a second input for receiving an enable voltage level, and an output for generating an enable signal to a power supply input of the first comparator;

wherein the second comparator is arranged to generate the enable signal to enable the first comparator when the voltage level of the analog power supply signal is higher than the enable voltage level, and arranged to generate the enable signal to disable the first comparator when the voltage level of the analog power supply signal is lower than the enable voltage level.

15. The circuit of claim 12, wherein the current generating circuit comprises a programmable current generating array comprising a plurality of transistors connected in parallel, and the processing circuit is arranged to turn on different transistors among the plurality of transistors to control the current generating circuit to generate different current amount levels.

16. The circuit of claim 12, wherein the analog current signal and a current signal passing through the processing circuit are transmitted via the ground pin to the charging device.

17. A controlling circuit utilized in an ear bud device which can be charged by a charging device, a communication interface being disposed between the ear bud device and the charging device, the controlling circuit being coupled between a power input pin and a ground pin of the communication interface and being coupled to the charging device only via the power input pin and the ground pin, and the controlling circuit comprises:

a current generating circuit, coupled to the power input pin and the ground pin, to be connected to the charging device via the power input pin and the ground pin;

a processing circuit, coupled to the current generating circuit, for generating a digital output signal into the current generating circuit to control the current generating circuit to generate and transmit an analog current signal corresponding to the digital output signal to the charging device via the ground pin to send data information from the ear bud device to the charging device, the analog current signal having different current levels corresponding to different logic levels of the digital output signal.

18. The circuit of claim 17, wherein the current generating circuit comprises a programmable current generating array comprising a plurality of transistors connected in parallel, and the processing circuit is arranged to turn on different transistors among the plurality of transistors to control the current generating circuit to generate different current amount levels.

19. The circuit of claim 17, wherein the processing circuit is coupled to the power input pin and the ground pin, and the analog current signal and a current signal passing through the processing circuit are transmitted via the ground pin to the charging device.

* * * * *